US010319749B1

(12) United States Patent
Zhou et al.

(10) Patent No.: US 10,319,749 B1
(45) Date of Patent: Jun. 11, 2019

(54) ARRAY SUBSTRATE, FABRICATING METHOD FOR THE SAME AND DISPLAY DEVICE

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Zhichao Zhou, Guangdong (CN); Hui Xia, Guangdong (CN); Meng Chen, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/003,845

(22) Filed: Jun. 8, 2018

Related U.S. Application Data

(63) Continuation of application No. PCT/CN2018/073095, filed on Jan. 17, 2018.

(30) Foreign Application Priority Data

Dec. 28, 2017 (CN) .......................... 2017 1 1460896

(51) Int. Cl.
*H01L 27/12* (2006.01)
*G02F 1/1368* (2006.01)
(Continued)

(52) U.S. Cl.
CPC .......... *H01L 27/124* (2013.01); *G02F 1/1368* (2013.01); *G02F 1/134309* (2013.01);
(Continued)

(58) Field of Classification Search
CPC .............. H01L 27/124; H01L 27/1288; H01L 27/1225; G02F 1/134309; G02F 1/136286; G02F 1/1368; G02F 2201/123
See application file for complete search history.

(56) References Cited

U.S. PATENT DOCUMENTS 6,140,158 A    10/2000  Rhee et al.
9,397,194 B2 *  7/2016  Yamazaki ........... H01L 29/4908
(Continued)

FOREIGN PATENT DOCUMENTS

CN    101105615 A    1/2008
CN    102148196 A    8/2011
(Continued)

*Primary Examiner* — John P. Dulka
(74) *Attorney, Agent, or Firm* — Hauptman Ham, LLP

(57) ABSTRACT

An array substrate includes a pixel structure formed on a substrate. The pixel structure is provided with a transistor region and a pixel region. A source electrode and a drain electrode in the pixel region are located in the transistor region and insulated from each other. A data line is electrically connected to the drain electrode. A pixel electrode is located in the pixel region and electrically connected to the source electrode. A copper metal layer is deposited on the data line and a drain electrode; a semiconductor active layer is formed between the source and drain electrodes and respectively connecting with the source and drain electrodes; a gate insulating layer overlying the data line and the drain electrode. The transparent electrode layer, the copper metal layer and the semiconductor active layer; the gate line and the gate electrode electrically connect to each other on the gate insulating layer.

20 Claims, 7 Drawing Sheets

(51) Int. Cl.
*G02F 1/1362* (2006.01)
*G02F 1/1343* (2006.01)

(52) U.S. Cl.
CPC .... *G02F 1/136286* (2013.01); *H01L 27/1225* (2013.01); *H01L 27/1288* (2013.01); *G02F 2201/123* (2013.01)

(56) References Cited

U.S. PATENT DOCUMENTS

| | | | |
|---|---|---|---|
| 9,425,045 B2 * | 8/2016 | Yamazaki | H01L 21/02554 |
| 9,703,157 B2 * | 7/2017 | Yamazaki | H01L 27/0248 |
| 9,780,121 B2 * | 10/2017 | Watanabe | H01L 27/1225 |
| 9,997,568 B2 * | 6/2018 | Yamazaki | B82Y 10/00 |

FOREIGN PATENT DOCUMENTS

| | | |
|---|---|---|
| CN | 102637636 A | 8/2012 |
| CN | 102646792 A | 8/2012 |
| CN | 102903675 A | 1/2013 |

* cited by examiner

ARRAY SUBSTRATE, FABRICATING METHOD FOR THE SAME AND DISPLAY DEVICE

RELATED APPLICATIONS

This application is a continuation application of PCT Patent Application No. PCT/CN2018/073095, filed Jan. 17, 2018, which claims the priority benefit of Chinese Patent Application No. 201711460896.1, filed Dec. 28, 2017, which is herein incorporated by reference in its entirety.

FIELD OF THE DISCLOSURE

The present invention relates to the field of flat panel display technology, in particular, to an array substrate and to a method for fabricating the same, and also relates to a display device including the array substrate.

BACKGROUND

A flat panel display with thin body, power saving, no radiation and many other advantages, has been widely used. A conventional flat panel display device includes a liquid crystal display device (Liquid Crystal Display, LCD) and a organic electroluminescence display device (Organic Light Emitting Display, OLED). A thin film transistor (Thin Film Transistor, TFT) array substrate is an important part of a flat panel display device, may be formed on a glass substrate or a plastic substrate.

In the process of manufacturing the array substrate by number (Mask) process is used to reduce the reticle, can significantly reduce the manufacturing cost of the array substrate, and thus can reduce the manufacturing cost of the TFT-LCD. In the prior art, the process from the initial 7 photo-mask technology for manufacturing the array substrate 4 photo-mask current technology, are used to form a patterning gate, the patterned active layer and the source/drain electrodes, via holes of pixel Electrode, patterned pixel electrodes.

In addition, as the display panel resolution and size increase, the signal delay phenomenon will be more serious, and reduction of the wiring resistance has become an urgent need. Copper (Cu) is second only to silver (Ag) and has a low cost of raw materials. It is considered as the most promising low-resistivity wiring material. Copper has been used in the prior art as a wiring material on an array substrate. However, using copper as a wiring material on an array substrate has a problem of increasing the number of mask processes or increasing the difficulty of a mask process. Therefore, the way how to optimize the array substrate structure makes copper be used as a wiring material under a relatively simple process condition. This is a problem that the industry has been trying to solve.

SUMMARY

In view of this, the present invention provides an array substrate and a method for fabricating the same. By optimizing the structure of the array substrate, copper can be used as a wiring material under simpler process conditions.

In order to achieve the above object, the present invention adopts the following technical solutions: an array substrate, comprising a pixel structure formed on a base substrate, the pixel structure being provided with a transistor region and a pixel region, wherein the pixel structure comprises: a transparent electrode layer comprising a data line, a source electrode, a drain electrode and a pixel electrode, the source electrode and the drain electrode being located in the transistor region and insulated from each other, the data line being electrically connected to the drain electrode, and the pixel electrode located in the pixel region and electrically connected to the source electrode; a copper metal layer deposited on the data line and the drain electrode; a semiconductor active layer formed between the source electrode and the drain electrode and respectively connecting the source electrode and the drain electrode; a gate insulating layer overlying the transparent electrode layer, the copper metal layer and the semiconductor active layer; a gate line and a gate electrode electrically connected with each other are formed on the gate insulating layer, and the gate electrode and the semiconductor active layer overlap to each other.

The material of the transparent electrode layer is ITO.

The material of the semiconductor active layer is carbon nanotubes.

The material of the semiconductor active layer is an oxide semiconductor material.

The oxide semiconductor material is selected from any one or two or more of ZnO, InZnO, ZnSnO, GaInZnO and ZrInZnO.

The semiconductor active layer is formed between the source electrode and the drain electrode, an active end of the semiconductor active layer extends onto the copper metal layer to connect with the drain electrode and another end of the semiconductor active layer extends onto the source electrode to connect with the source electrode.

The material of the gate insulating layer is a combination of SiOx or SiNx or both.

The material of the gate line and the gate electrode is titanium or molybdenum or a combination of both.

The present invention provides a method for fabricating an array substrate as described above, which comprises: forming a patterned transparent electrode layer on a base substrate by using a first photo-mask process; depositing the copper metal layer on the data line and the drain electrode by using an electroplating process; forming a patterned semiconductor active layer on the base substrate by using a second photo-mask process; depositing a gate insulating layer on the base substrate, the gate insulating layer covering the transparent electrode layer, the copper metal layer and the semiconductor active layer; forming a patterned gate line and a gate electrode on the gate insulating layer by a third photo-mask process.

The present invention also provides a display device, which includes the array substrate as described above.

The array substrate provided in the embodiment of the present invention uses a copper material as a wiring material for a part of electrodes and signal lines, thereby the wiring resistance reduces and the signal transmission performance of the array substrate improves. In addition, the array substrate can be prepared through three photo-mask processes, which reduces the number of mask processes and reduces the production cost compared with the prior art.

DETAILED DESCRIPTION OF PREFERRED EMBODIMENTS

Figure 1:
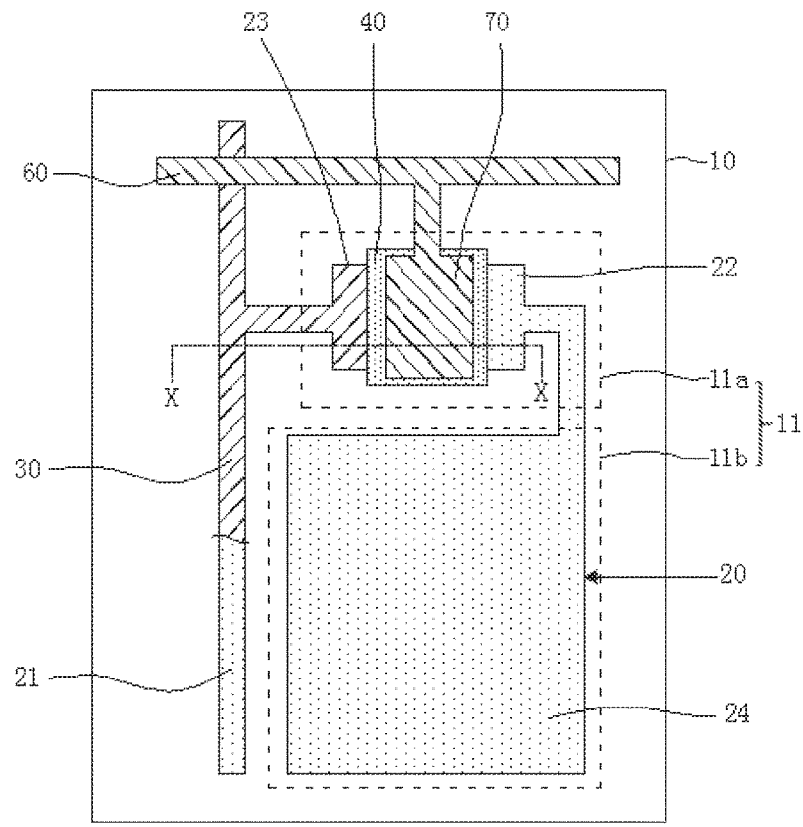
FIG. 1 is a schematic plan view of an array substrate according to an embodiment of the present disclosure.

To make the objectives, technical solutions, and advantages of the present invention clearer, the following describes the specific implementation manners of the present invention in detail with reference to the accompanying drawings. Examples of these preferred embodiments are illustrated in the drawings. The embodiments of the present invention shown in the drawings and described in the drawings are merely exemplary and the present invention is not limited to these embodiments.

Here, it should also be noted that in order to avoid obscuring the present invention by unnecessary details, only the structures and/or processing steps that are closely related to the solutions according to the present invention are shown in the drawings. Other details of the invention are of little relevance.

Figure 2:
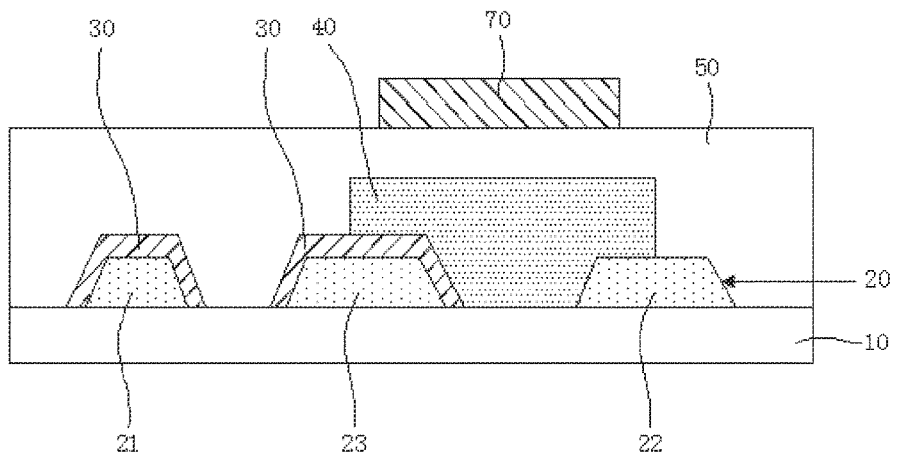
FIG. 2 is a schematic cross-sectional view taken along X-X line in FIG. 1.

The present embodiment provides an array substrate referring to FIG. 1 and FIG. 2. FIG. 1 is a schematic planar structure of an array substrate according to an embodiment, and FIG. 2 is a schematic cross-sectional view along a line X-X in FIG. 1. The array substrate includes a pixel structure 11 formed on a base substrate 10. The pixel structure 11 is provided with a transistor region 11a and a pixel region 11b. The pixel structure 11 includes a patterned transparent electrode layer 20, a Cu metal layer 30, a patterned semiconductor active layer 40, a gate insulation layer 50, a patterned gate line 60, and a gate electrode 70.

The transparent electrode layer 20 is formed on the base substrate 10. The transparent electrode layer 20 includes a data line 21, a source electrode 22, a drain electrode 23 and a pixel electrode 24. The source electrode 22 and the drain electrode 23 are located in the transistor region 11a and insulated from each other. The data line 21 extends into the transistor region 11a and is electrically connected to the drain electrode 23. The pixel electrode 24 is located in the pixel region 11b and electrically connected to the source electrode 22.

The copper metal layer 30 is deposited on the data line 21 and the drain electrode 23.

The semiconductor active layer 40 is formed between the source electrode 22 and the drain electrode 23 and connects the source electrode 22 and the drain electrode 23 respectively.

The gate insulating layer 50 is formed on the base substrate 10. The gate insulating layer 50 covers the transparent electrode layer 20, the copper metal layer 30 and the semiconductor active layer 40. It should be noted that the gate insulating layer 50 is not shown in the plan view of FIG. 1.

The gate line 60 and the gate electrode 70 are formed on the gate insulating layer 50. The gate electrode 70 is located in the transistor region 11a and has a portion overlapping with the semiconductor active layer 40.

The array substrate as described above, and the copper metal layer 30 is deposited on the data line 21 and the drain electrode 23 as part of the wiring structure of the data line 21 and the drain electrode 23, for reducing the wiring resistance of the data line and the drain electrode and improving the signal transmission performance of the array substrate.

As shown in FIG. 2, the semiconductor active layer 40 is formed between the source electrode 22 and the drain electrode 23, one end of the semiconductor active layer 40 extends onto the copper metal layer 30 to connect with the drain electrode 23, and the other end extended onto the source electrode 22 to connect with the source electrode 22. It should be noted that, in the structure of the thin film transistor, the positions of the source electrode and the drain electrode are interchangeable. That is, in the array substrate as described above, the electrode connected to the data line 21 may also be an electrode provided as a source electrode, and the electrode connected to the pixel electrode 24 is set as a drain electrode. At this time, the copper metal layer 30 is deposited on the data line and the source electrode.

The material of the transparent electrode layer 20 can be selected from ITO. The material of the semiconductor active layer 40 can be selected from a carbon nanotube or oxide semiconductor material or other semiconductor material such as amorphous silicon or polysilicon. The material of the gate insulating layer 50 may be selected to be a combination of SiOx or SiNx or both. The material of the gate line 60 and the gate electrode 70 may be selected from molybdenum (Mo) or titanium (Ti) or a combination of both.

Preferably, a material of the semiconductor active layer 40 is selected as an oxide semiconductor material, and may be selected from any one or two or more of ZnO, InZnO, ZnSnO, GaInZnO, and ZrInZnO.

Figure 3:
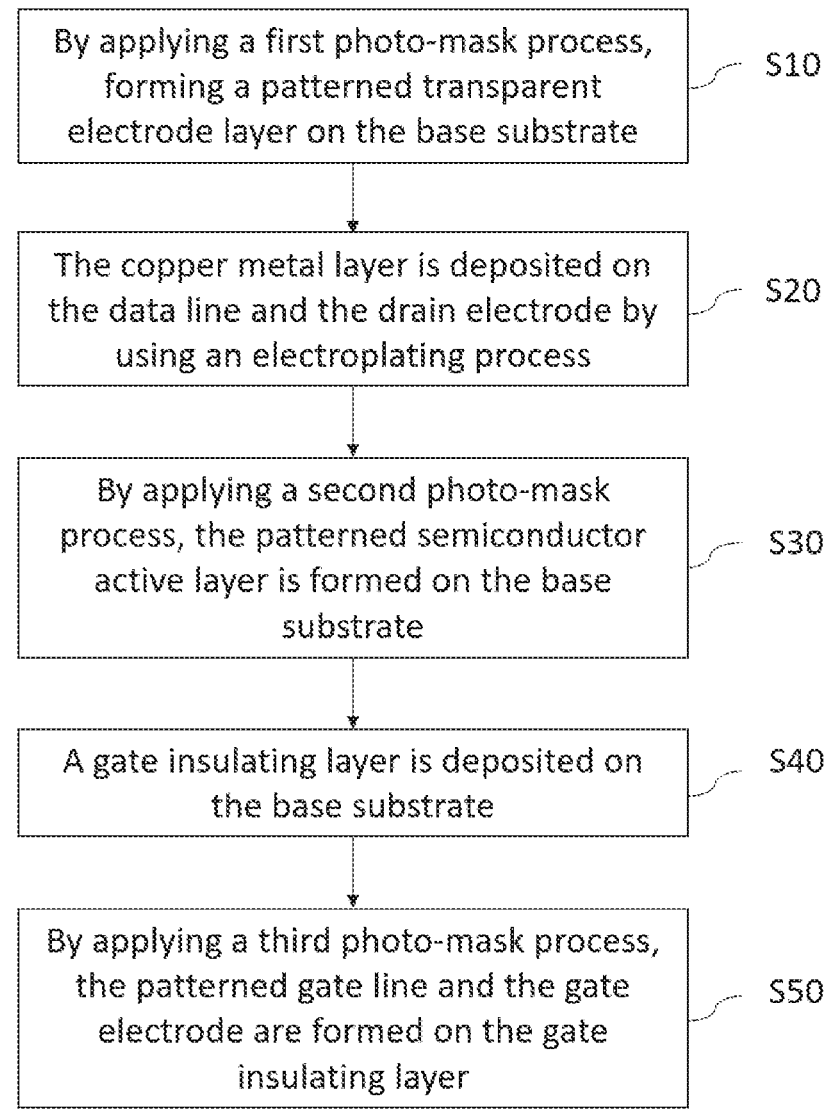
FIG. 3 is a process flow diagram of a method for preparing an array substrate according to an embodiment of the present disclosure.
Figure 4A:
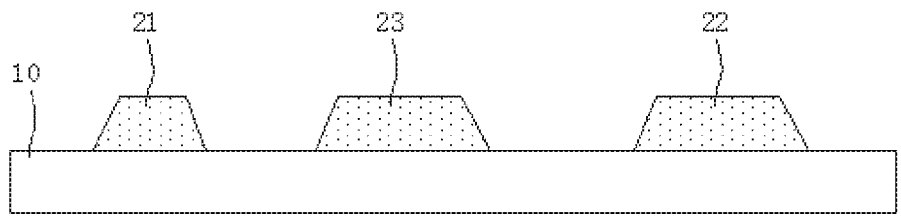
FIG. 4a-FIG. 4i is the method of the array substrate of the present invention prepared according to the respective steps in an embodiment, illustrating an exemplary structure of a device obtained in respective steps.
Figure 4B:
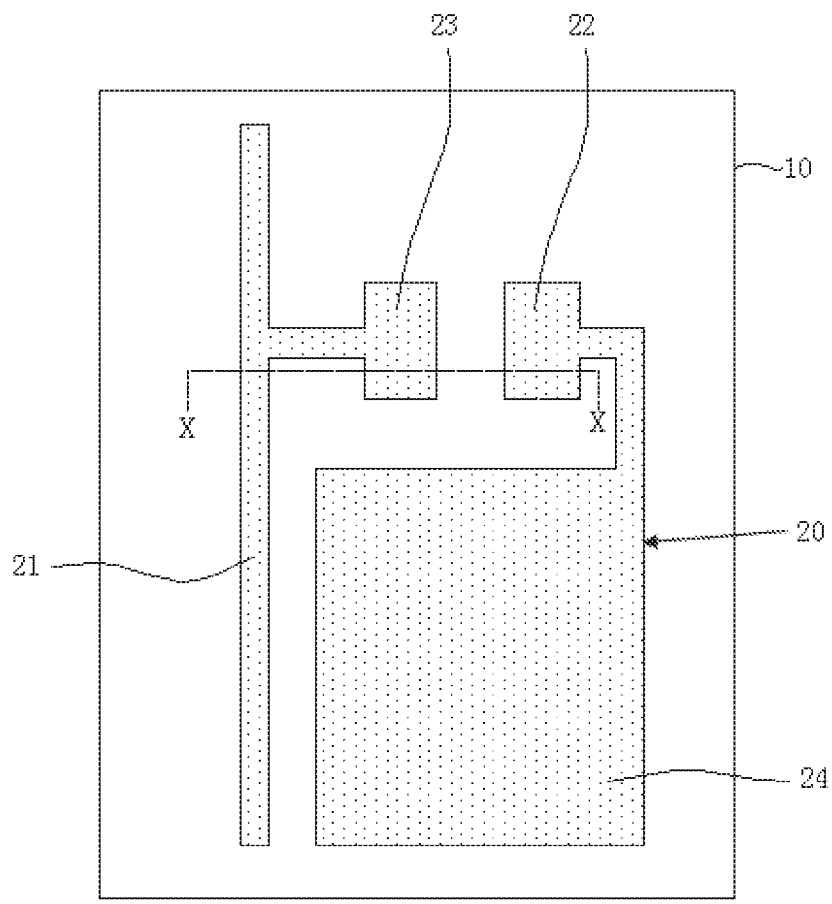

The present embodiment also provides a method for preparing a thin film transistor array substrate as described above, the following refer to FIG. 3 and FIG. 4a-4i, in conjunction with FIGS. 1 and 2 describes the process of the preparation method. As shown in FIG. 3, the preparation method comprises the steps of:

S10, FIGS. 4a and 4b, by applying a first photo-mask process, forming a patterned transparent electrode layer 20 on the base substrate 10. FIG. 4b is a schematic planar structure of FIG. 4a, and FIG. 4b is a schematic cross-sectional view along a line X-X in FIG. 4b.

Specifically, the base substrate 10 is provided at first, and a transparent conductive film is deposited on the base substrate 10. Then, the transparent conductive film is patterned to form the transparent electrode layer 20, which includes a patterned data line 21, a patterned source electrode 22, a patterned drain electrode 23 and a patterned pixel electrode 24.

Figure 4C:
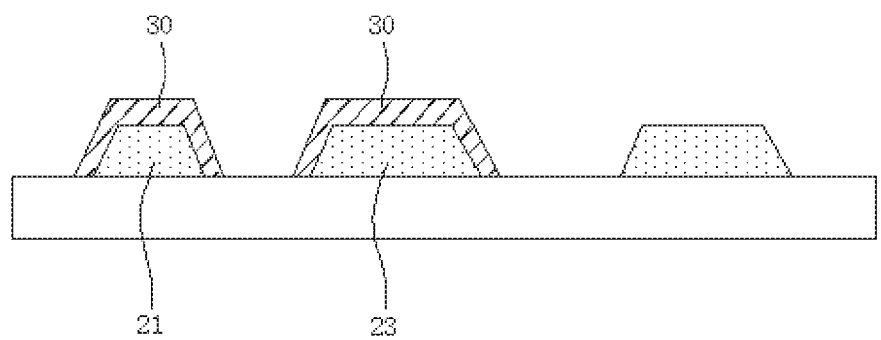
Figure 4D:
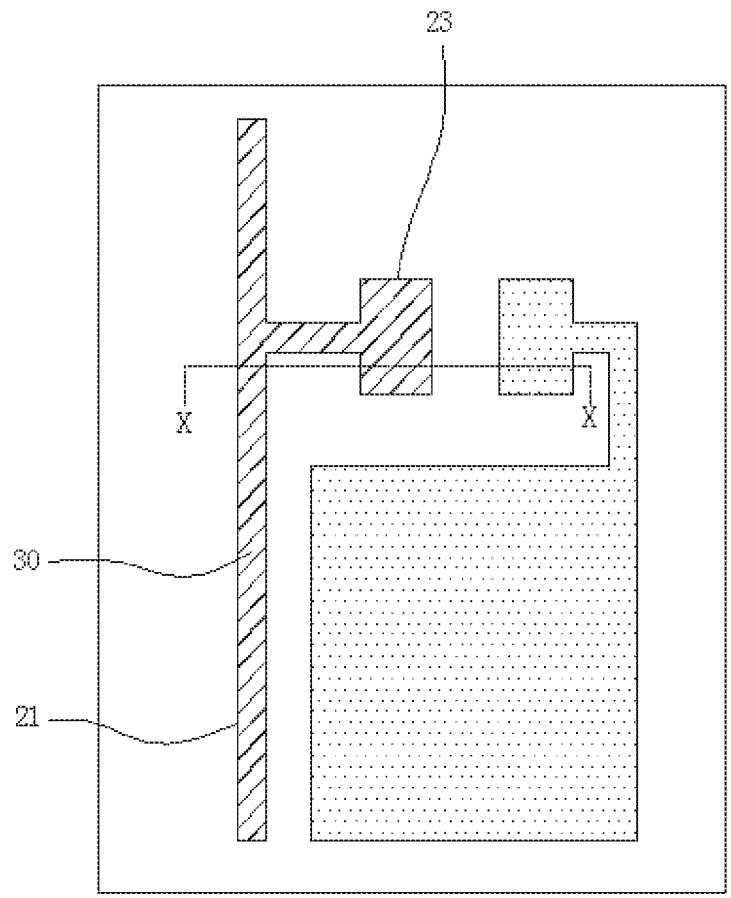

S20: As shown in FIGS. 4c and 4d, the copper metal layer 30 is deposited on the data line 21 and the drain electrode 23 by using an electroplating process. FIG. 4d is a schematic plane view of FIG. 4c is a schematic cross-sectional view along a line X-X in FIG. 4d.

In particular, copper metal is electroplated for the data lines 21 and the drain electrode 23, and the copper plating layer is obtained on the top and side surfaces of the data line 21 and the drain electrode 23 to form the copper metal.

Figure 4E:
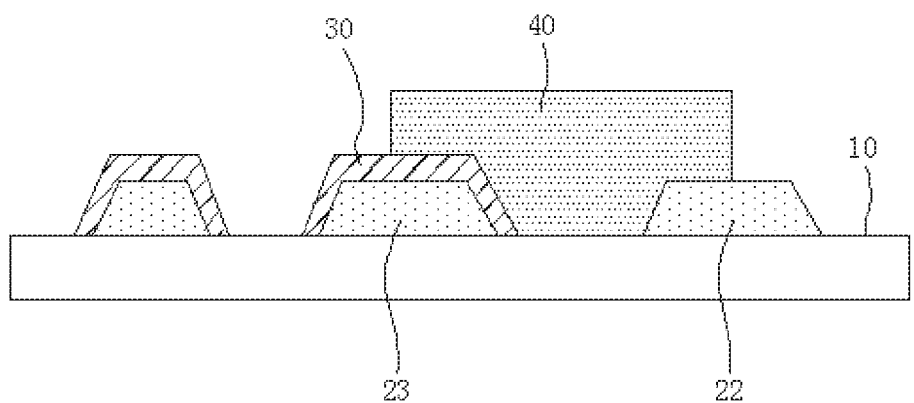
Figure 4F:
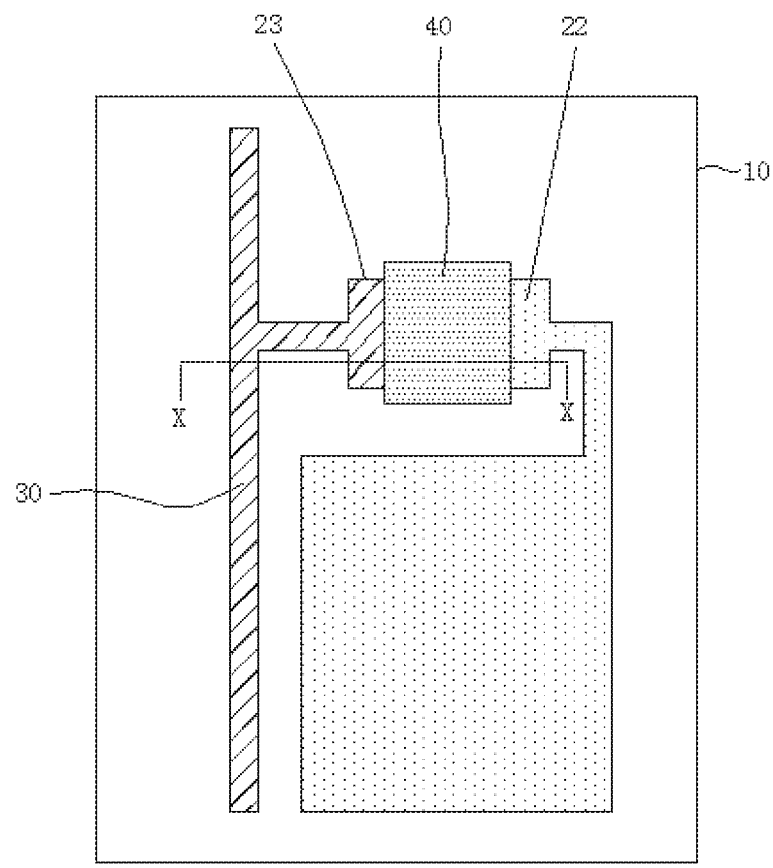

S30: as shown in FIGS. 4e and 4f, by applying the second photo-mask process, the patterned semiconductor active layer 40 is formed on the base substrate 10. FIG. 4f is a schematic plane view of FIG. 4e, which is a cross-sectional view along a line X-X in FIG. 4f.

Specifically, a semiconductor film is first deposited on the base substrate 10, and then the semiconductor film is patterned to form the semiconductor active layer 40. The semiconductor active layer 40 is formed between the source electrode 22 and the drain electrode 23 and one end of the semiconductor active layer 40 extends onto the copper metal layer 30 to be connected to the drain electrode 23 and the other end extends to the source electrode 22 to connect with the source electrode 22.

Figure 4G:
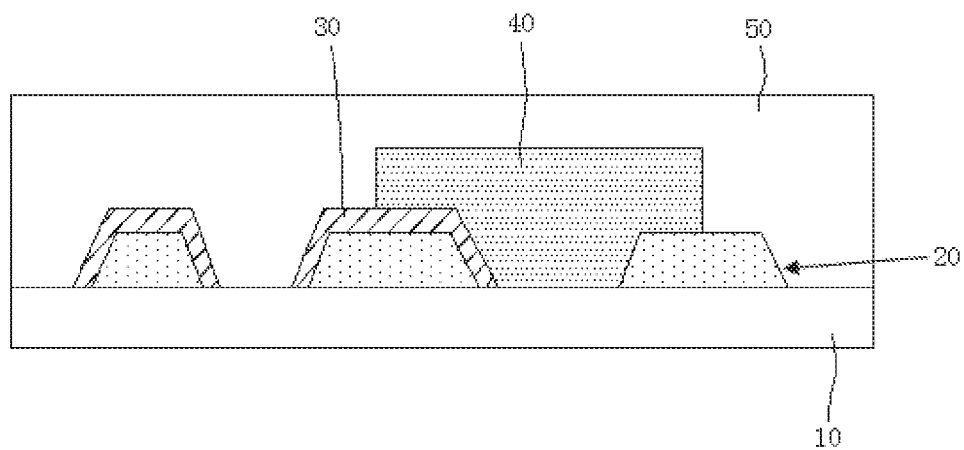

S40: as shown in FIG. 4g, a gate insulating layer 50 is deposited on the base substrate 10. Specifically, the gate insulating layer 50 can be obtained by using a chemical vapor deposition process. The gate insulating layer 50 covers the transparent electrode layer 20, the copper metal layer 30 and the semiconductor active layer 40.

Figure 4H:
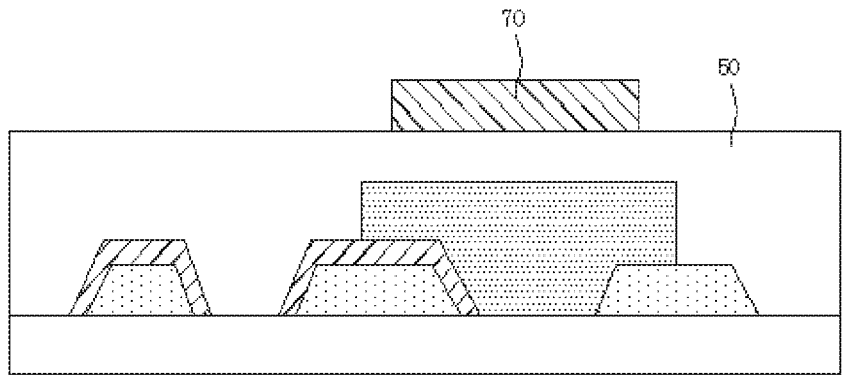
Figure 4I:
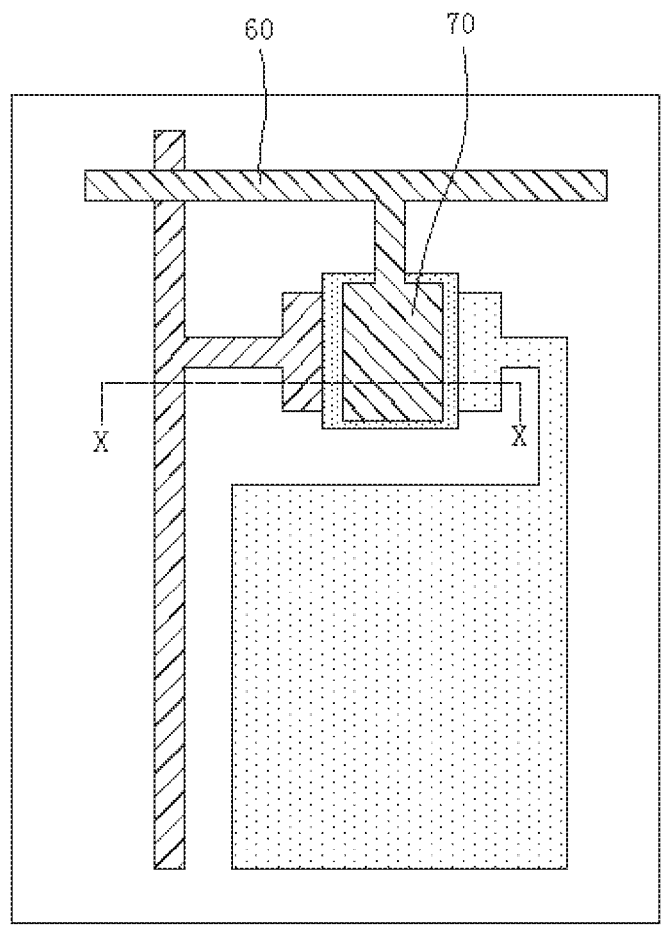

S50: as shown in FIG. 4h and FIG. 4i, by applying a third photo-mask process, he patterned gate line 60 and the gate electrode 70 are formed on the gate insulating layer 50. FIG. 4i is a schematic plane view of 4h, as shown in FIG. 4h is a schematic cross-sectional view along a line X-X in FIG. 4i.

Specifically, a conductive metal film is firstly deposited on the gate insulating layer 50, and then the conductive metal film is patterned to form the gate line 60 and the gate electrode 70, the array substrate is finally formed as shown in FIG. 1 and FIG. 2. It should be noted that the gate insulating layer 50 is not shown in the plan view of FIG. 4i.

According to the fabricating method for an array substrate as described above, a combination of a photo-mask process (a patterning process) and an electroplating process can be used to obtain an array substrate with a copper material wiring structure through three photo-mask processes, which reduces the number of the mask process, achieving the use of copper as a wiring material in a relatively simple process conditions, and reducing the cost of production.

Figure 5:
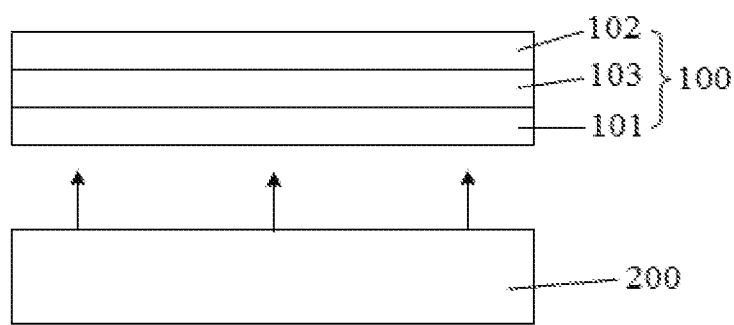
FIG. 5 is a schematic structural diagram of a display device according to an embodiment of the present disclosure.

The embodiment further provides a display device, in which the thin film transistor array substrate provided by the embodiment of the present invention is used. Specifically, the display device provided in this embodiment is a liquid crystal display device as an example. Referring to FIG. 5, the liquid crystal display device includes a liquid crystal panel 100 and a backlight module 200. The liquid crystal panel 100 is disposed opposite to the backlight module 200. The backlight module 200 provides a display light source to the liquid crystal panel 100 so that the liquid crystal panel 100 displays an image. The liquid crystal panel 100 includes an array substrate 101 and a color filter substrate 102 opposite to each other, and a liquid crystal layer 103 between the array substrate 101 and the filter substrate 102. The array substrate 101 adopts the array substrate provided by the embodiment of the present invention.

In summary, the array substrate provided by the embodiment of the present invention uses a copper material as a wiring material for a part of electrodes and signal lines, reduces the wiring resistance and improves the signal transmission performance of the array substrate. In addition, the array substrate can be prepared through three photo-mask processes, which reduces the number of mask processes and reduces the production cost compared with the prior art.

Incidentally, herein, relational terms such as first and second and the like are only used to distinguish one entity or operation from another entity or action without necessarily requiring or implying these entities the presence of any such actual relationship or order between or operations. Further, the term "comprising", "containing" or any other variation thereof are intended to cover a non-exclusive inclusion, such that a process, method, article, article, or apparatus not include only those elements but not expressly listed further comprising the other elements, or further comprising such process, method, article, or apparatus inherent elements. Without more constraints, by the wording "include a . . . " defined does not exclude the existence of additional identical elements in the element comprising a process, method, article, or apparatus.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. An array substrate, comprising a pixel structure formed on a base substrate, the pixel structure being provided with a transistor region and a pixel region, wherein the pixel structure comprises:
   a transparent electrode layer comprising a data line, a source electrode, a drain electrode and a pixel electrode, the source electrode and the drain electrode being located in the transistor region and insulated from each other, the data line being electrically connected to the drain electrode, and the pixel electrode being located in the pixel region and electrically connected to the source electrode;
   a copper metal layer deposited on the data line and the drain electrode;
   a semiconductor active layer formed between the source electrode and the drain electrode and respectively connecting the source electrode and the drain electrode;
   a gate insulating layer overlying the transparent electrode layer, the copper metal layer and the semiconductor active layer;
   a gate line and a gate electrode electrically connected with each other are formed on the gate insulating layer, and the gate electrode and the semiconductor active layer overlap to each other.

2. The array substrate according to claim 1, wherein material of the transparent electrode layer is ITO.

3. The array substrate according to claim 1, wherein material of the semiconductor active layer is carbon nanotubes.

4. The array substrate according to claim 1, wherein material of the semiconductor active layer is an oxide semiconductor material.

5. The array substrate according to claim 4, wherein the oxide semiconductor material is selected from any one or two or more of ZnO, InZnO, ZnSnO, GaInZnO, and ZrInZnO.

6. The array substrate according to claim 1, wherein the semiconductor active layer is formed between the source electrode and the drain electrode, an end of the semiconductor active layer extends onto the copper metal layer to connect with the drain electrode and another end of the semiconductor active layer extends onto the source electrode to connect with the source electrode.

7. The array substrate of claim 1, wherein material of the gate insulating layer is a combination of SiOx or SiNx or both.

8. The array substrate according to claim 1, wherein material of the gate line and the gate electrode is titanium or molybdenum or a combination of both.

9. A method for fabricating an array substrate, comprising:
   forming a patterned transparent electrode layer on a base substrate by using a first photo-mask process, wherein the transparent electrode layer comprises a data line, a source electrode, a drain electrode and a pixel electrode; the source electrode and the drain electrode are located in a transistor region and the data lines are electrically connected to the drain electrode, the pixel electrode is located in the pixel region and electrically connected to the source electrode;

depositing the copper metal layer on the data line and the drain electrode by using an electroplating process;

forming a patterned semiconductor active layer on the base substrate by using a second photo-mask process; the semiconductor active layer is formed between the source electrode and the drain electrode and respectively connected to the source electrode and the drain electrode;

depositing a gate insulating layer on the base substrate, the gate insulating layer covering the transparent electrode layer, the copper metal layer and the semiconductor active layer;

forming a patterned gate line and a gate electrode on the gate insulating layer by using a third photo-mask process, the gate electrode and the semiconductor active layer have overlapping portions.

10. The method for manufacturing the array substrate according to claim 9, wherein material of the transparent electrode layer is ITO.

11. The method for manufacturing the array substrate according to claim 9, wherein material of the semiconductor active layer is carbon nanotube or oxide semiconductor material.

12. The method for manufacturing the array substrate according to claim 9, wherein the semiconductor active layer is formed between the source electrode and the drain electrode, and one end of the semiconductor active layer extends onto the copper metal layer to connect with the drain electrode and another end of the semiconductor active layer extends onto the source electrode to connect with the source electrode.

13. A display device comprising an array substrate, comprising a pixel structure formed on a substrate, the pixel structure being provided with a transistor area and a pixel area, wherein the pixel structure comprises:

a transparent electrode layer comprising a data line, a source electrode, a drain electrode and a pixel electrode, wherein the source electrode and the drain electrode being located in the transistor region and insulated from each other, the data line being electrically connected to the drain electrode, the pixel electrode being located in the pixel region and electrically connected to the source electrode;

a copper metal layer deposited on the data line and the drain electrode;

a semiconductor active layer formed between the source electrode and the drain electrode and respectively connecting to the source electrode and the drain electrode;

a gate insulating layer overlying the transparent electrode layer, the copper metal layer and the semiconductor active layer;

a gate line and a gate electrode electrically connected with each other are formed on the gate insulating layer, and the gate electrode and the semiconductor active layer overlap each other.

14. The display device according to claim 13, wherein material of the transparent electrode layer is ITO.

15. The display device according to claim 13, wherein material of the semiconductor active layer is carbon nanotube.

16. The display device according to claim 13, wherein material of the semiconductor active layer is an oxide semiconductor.

17. The display device according to claim 16, wherein material of the oxide semiconductor is selected from any one or two or more of ZnO, InZnO, ZnSnO, GaInZnO, and ZrInZnO.

18. The display device according to claim 13, wherein the semiconductor active layer is formed between the source electrode and the drain electrode, and one end of the semiconductor active layer extends onto the copper metal layer to connect with the drain electrode and another end of the semiconductor active layer onto the source electrode to connect with the source electrode.

19. The display device according to claim 13, wherein material of the gate insulating layer is SiOx, SiNx or a combination of both.

20. The display device according to claim 13, wherein material of the gate line and the gate electrode is molybdenum, titanium or a combination of both.

* * * * *